(12) United States Patent
Chang et al.

(10) Patent No.: US 6,194,295 B1
(45) Date of Patent: Feb. 27, 2001

(54) PRODUCTION OF A REFRACTORY METAL BY CHEMICAL VAPOR DEPOSITION OF A BILAYER-STACKED TUNGSTEN METAL

(75) Inventors: Kow-Ming Chang; I-Chung Deng; Ta-Hsun Yeh, all of Hsinchu (TW)

(73) Assignee: National Science Council of Republic of China, Taipei (TW)

( * ) Notice: Subject to any disclaimer, the term of this patent is extended or adjusted under 35 U.S.C. 154(b) by 0 days.

(21) Appl. No.: 09/312,483

(22) Filed: May 17, 1999

(51) Int. Cl.[7] .................. H01L 21/3205; H01L 21/44
(52) U.S. Cl. .................. 438/586; 438/618; 438/660; 438/675
(58) Field of Search .................. 438/256, 675, 438/618, 268, 273, 586, 784, 660, 659; 257/750, 751, 753

(56) References Cited

U.S. PATENT DOCUMENTS

| | | | |
|---|---|---|---|
| 4,080,721 | * | 3/1978 | Hung .................. 29/578 |
| 5,094,965 | * | 3/1992 | Ozaki et al. .................. 437/40 |
| 5,892,281 | * | 4/1999 | Akram et al. .................. 257/750 |
| 6,030,894 | * | 2/2000 | Hada et al. .................. 438/675 |
| 6,074,960 | * | 6/2000 | Lee et al. .................. 438/79 |
| 6,093,602 | * | 7/2000 | Li et al. .................. 438/256 |

\* cited by examiner

*Primary Examiner*—Richard Elms
*Assistant Examiner*—Michael S. Lebentritt
(74) *Attorney, Agent, or Firm*—Bacon & Thomas (57) ABSTRACT

Provided a process for producing a refractory metal by chemical vapor deposition of a bilayer-stacked tungsten metal by depositing a bilayer-stacked tungsten metal in a same chamber in the manner of not breaking the vacuum therein. Firstly, a layer of amorphous-like tungsten is deposited to increase thermal stability and to prevent diffusion of fluorine atom. Next, a nitridizing treatment is performed thereon to promote further the barrier property and thermal stability of the amorphous-like tungsten. Finally, conventional selective chemical vapor deposited tungsten having low is deposited on the amorphous-like tungsten. Through the deposition of bilayer tungsten according to the process of the invention, thermal stability of conventional selective chemical vapor deposited tungsten can be increased greatly. For the manufacture of a extremely large integrated circuit, stacked tungsten not only can prevent fluorine atom from diffusing downwardly in the course of deposition, but also can increase thermal stability, and furthermore, the resistance thereof is much lower that that of tungsten disilicide. Accordingly, the process of the invention is indeed a technique having high potential.

6 Claims, 14 Drawing Sheets

PRODUCTION OF A REFRACTORY METAL BY CHEMICAL VAPOR DEPOSITION OF A BILAYER-STACKED TUNGSTEN METAL

BACKGROUND OF THE INVENTION

1. Field of the Invention

The invention relates to a process for producing a refractory metal by chemical phase deposition of a bilayer-stacked tungsten metal, and in particular, to a process for producing a refractory metal by chemical vapor deposition of a bilayer-stacked tungsten metal through using a combination of amorphouslike tungsten nitride and a conventional tungsten metal layers to promote the reliability and stability of adjacent metal layers as well as to reduce the problem of fluorine contamination.

2. Description of the Prior Art

On view of the current technical level, in the latter stages of the manufacture of integrated circuit, it is better for the metal connector line to have a quicker propagation velocity, as well as in various process steps of the subsequent procession process, especially after heat treating, characteristics thereof shall not be caused to change. However, in the present rend, in order to search and study metal silicide having low resistance and high thermal stability, as well as to meet the requirement of ultra large integrated circuit, an device must be made from such metal silicide through a way of chemical vapor deposition. Unfortunately, typical chemical vapor deposition involves fluorine and infiltration of fluorine atom into the device will invariably impair the characteristics of the device.

In addition, according to the recent report, as the size of the device becomes smaller in the future, resistance of the interconnection line will increase in associated with the reduction of the width of the interconnection line. Therefore, it is the present trend to find a conducting material having low resistivity. While use of refractory metal silicide as the gate electrode of metal-oxide-semiconductor field effect transistor (MOSFET) or metal-oxide-semiconductor (MOS) capacitor has been studied for many years, the current topic focuses on the silicides of titanium and cobalt, whereas pure metal has been never employed due to problem of thermal stability. Further, the inward diffusion of fluorine atom during chemical vapor deposition of refractory metal and the outward diffusion of dopants from the polycrystalline silicon has been studied also.

At present, thermal stability has been considered mostly in the study and mass production of refractory metal material having low resistivity. The refractory metal silicide having lowest resistivity is titanium disilicide, but it does not exhibit sufficient thermal stability to meet the requirement of many heating steps in the subsequent procession process. Consequently, most of recent studies are directed to silicide of cobalt. However, there are problems in the silicidification of cobalt, such as, consumption of excess silicon, and lump aggregation.

In view of the foregoing, prior art materials do not how perfect designs and still have many disadvantages to be improved.

In view of various disadvantages derived from the conventional chemical vapor deposition process, the present inventors had tried to improve these and finally found, after persistently and extensively studying for many years, a process for producing a refractory metal by chemical vapor deposition of a bilayer-stacked tungsten metal, thus accomplished the present invention.

SUMMARY OF THE INVENTION

Accordingly, one of the object of the invention is to provide a process for producing a refractory metal by chemical vapor deposition of a bilayer-stacked tungsten metal, wherein pure refractory metal is used to replace refractory metal silicide for obtaining less resistivity, which is based on the fact that the resistivity of the conventional single-layer silicide is up to 70 $\mu\Omega$-cm, while that of stacked tungsten is 10 $\mu\Omega$-cm which is relatively close to that of pure metal.

The further object of the invention is to provide a process for producing a refractory metal by chemical vapor deposition of a bilayer-stacked tungsten metal, characterized in that amorphous-like tungsten used does not essentially contain grain boundaries such that fluorine atom will not diffuse into the underlayer material during the chemical vapor deposition and hence will not impair the characteristics of the device.

The another object of the invention is to provide a process for producing a refractory metal by chemical vapor deposition of a bilayer-stacked tungsten metal, characterized in that the nitridizing treatment after deposition of the amorphous-like tungsten can be carried out without breaking the vacuum such that the thermal stability and reliability can be improved.

Still another object of the invention is to provide a process for producing a refractory metal by chemical vapor deposition of bilayer-stacked tungsten metal, characterized in that the amorphous-like tungsten nucleates during deposition in the gas phase which does not cause the consumption of silicon on the surface of the silicon substrate during the deposition, and atoms such as phosphorus, boron, and arsenic in the polycrystalline silicon are confined such that they can not diffuse outwardly.

The present process for producing a refractory metal by chemical vapor deposition of a bilayer-stacked tungsten metal, which exhibits various advantages described above, comprises depositing a bilayer tungsten metal in a manner of not breaking the vacuum, by, firstly, depositing one layer of amorphous-like tungsten so as to increase thermal stability thereof and to prevent the diffusion of fluorine atom; then, performing a nitridizing treatment to further promote the fluorine barrier capacity and thermal stability of the amorphous-like tungsten; and finally, deposing a conventional selective chemical vapor deposited tungsten having low resistance on said amorphous-like tungsten to form a bilayer-stacked tungsten MOS capacitor or MOSFET structures that do not influence the propagation resistance thereof.

BRIEF DESCRIPTION OF THE DRAWINGS

The drawings disclose an illustrative embodiment of the present invention that services to exemplify the various advantages and objects hereof, and are as follows.

Symbols denote the main part as follows:

1 growing oxide layer of silicon dioxide
2 defining working region by yellow light imaging I
3 growing oxide layer of silicon dioxide
4 growing polycrystalline silicon
5 growing amorphous-like tungsten
6 after nitridizing treatment
7 growing typical tungsten
8 forming bilayer-stacked tungsten

DETAILED DESCRIPTION OF THE PREFERRED EMBODIMENT

Figure 1:
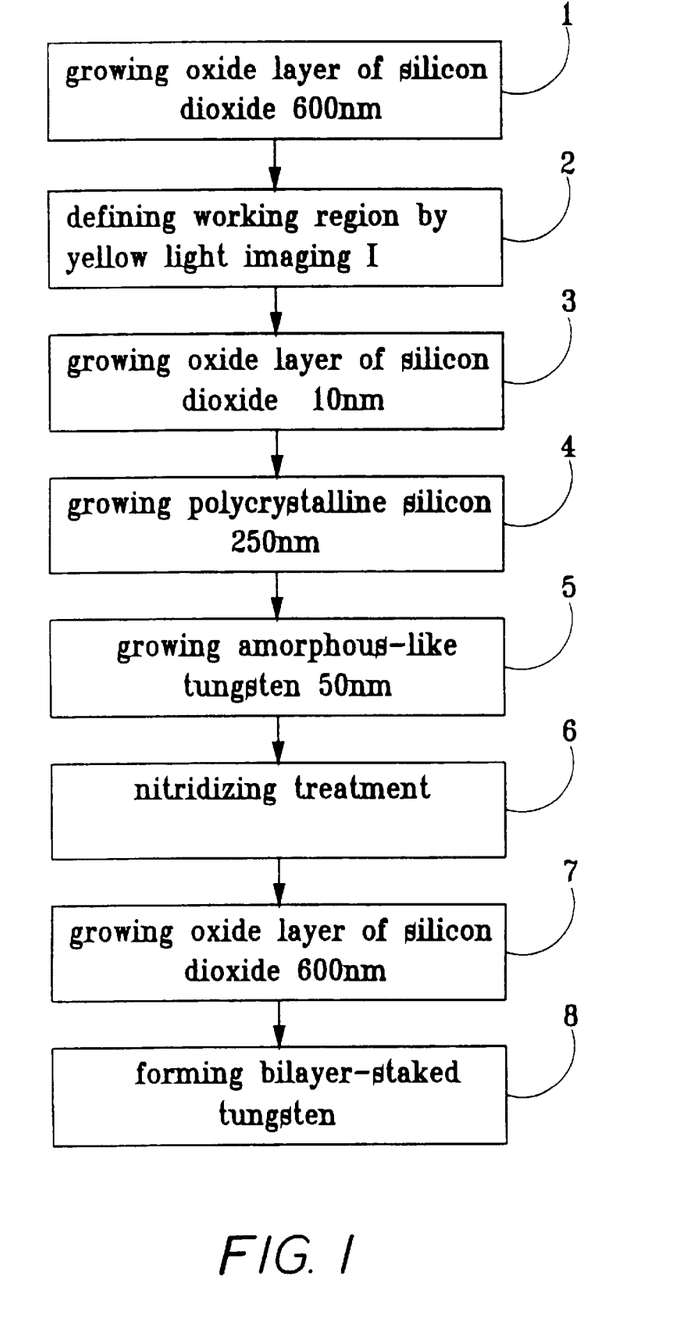
FIG. 1 shows the flowchart of the process for producing a refractory metal by chemical vapor deposition of a bilayer-stacked tungsten metal according to the invention.

Now, referring to FIG 1, there shows the flowchart of the process for producing a refractory metal by chemical vapor deposition of a bilayer-stacked tungsten metal according to the invention. In such process according to the invention, in the first step, a oxide layer as silicon dioxide having a thickness of 500 nm to be used as an insulating barrier was grown on a substrate. Next, in a second step, a work region was defined by yellow light imaging I. Then, in the third step, a silicon dioxide layer having a thickness of 10 nm to be used as the dielectric layer in the gate electrode was grown thereon. Thereafter, in the fourth step, a polycrystalline silicon layer having a thickness of 250 nm to be used as a stress buffering layer was grown on the dielectric layer. Then, an amorphous-like tungsten having a thickness of 50 nm was grown thereon (step 5) and was subjected to nitridizing treatment subsequently (step 6) to provide a barrier property similar to that of an amorphous tungsten as well as to increase thermal stability thereof. In a seventh step, a conventional tungsten layer having a thickness of 200 nm was grown; and finally, as the eighth step, a bilayer-stacked tungsten was formed through the above-described steps.

Figure 2A:
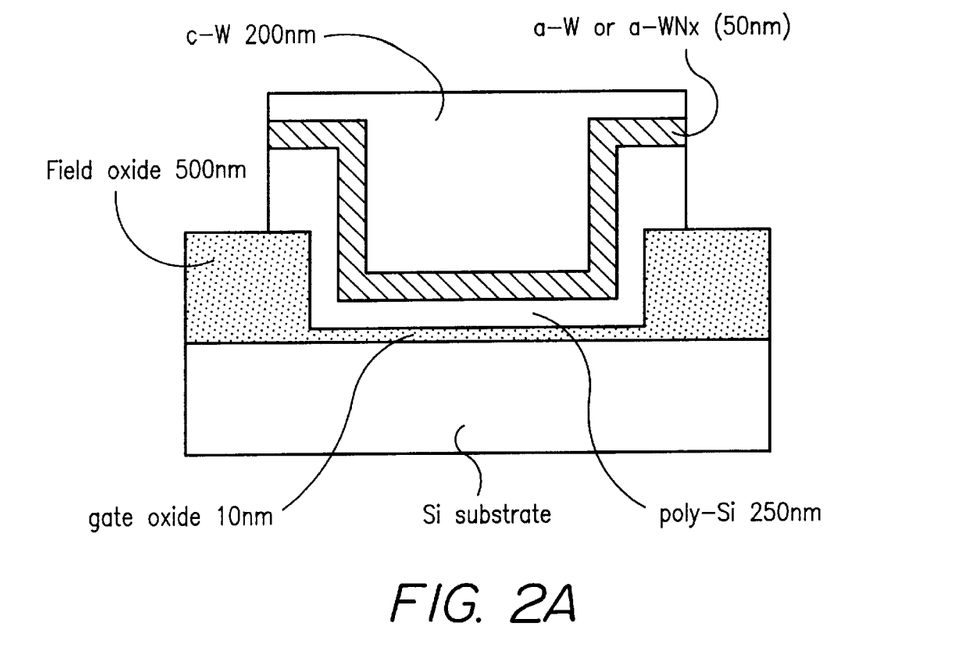
FIGS. 2A and 2B show the cross-section views of metal-oxide-semiconductor-capacitor consisted of the bilayer-stacked tungsten according to the invention and of a control sample, respectively.
Figure 2B:
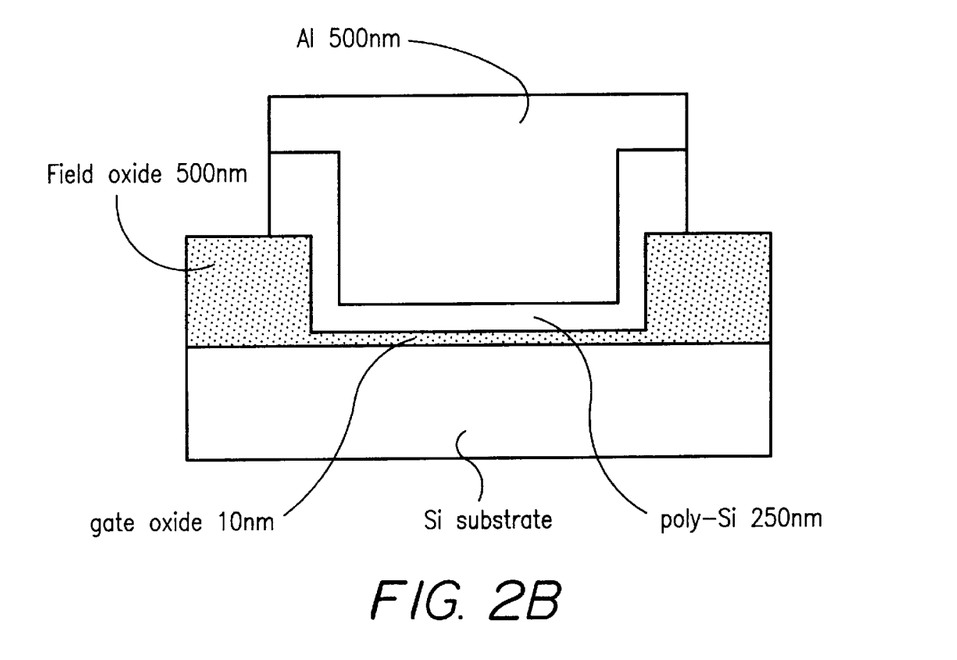

Referring to FIGS. 2A and 2B, there shows the cross-section views of MOS capacitor consisted of the bilayer-stacked tungsten according to the invention and of a control sample, respectively. Pure metallic tungsten was used as the electrode, as shown in FIG. 2A, a layer of amorphous-like tungsten was placed underneath the tungsten electrode, which was used as a barrier layer against diffusion such that is not only can increase the terminal stability but also can prevent the inward diffusion of fluorine atom as well as can not affect the propagation resistance. Moreover, in the process according to the invention, the bilayer-stacked tungsten was directly chemical vapor deposited in a manner of not breaking the vacuum, which is in contrary to that of the conventional chemical vapor deposition of metal as shown in FIG. 2B wherein, since there is only one single layer metal, fluorine atoms might infiltrate into the device and impair the characteristics of the device.

Figure 3A:
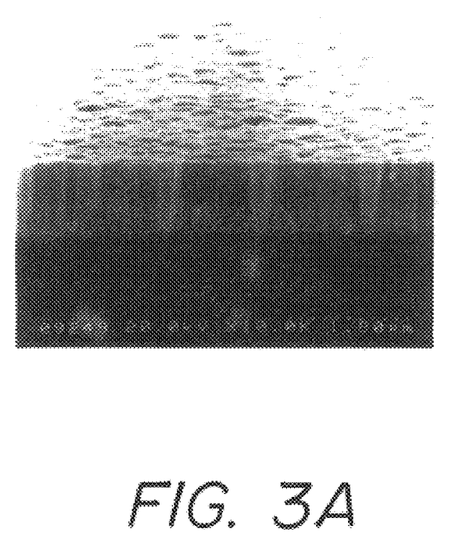
FIGS. 3A and 3B show structures of conventional chemical vapor deposition tungsten and of amorphous-like tungsten, respectively.
Figure 3B:
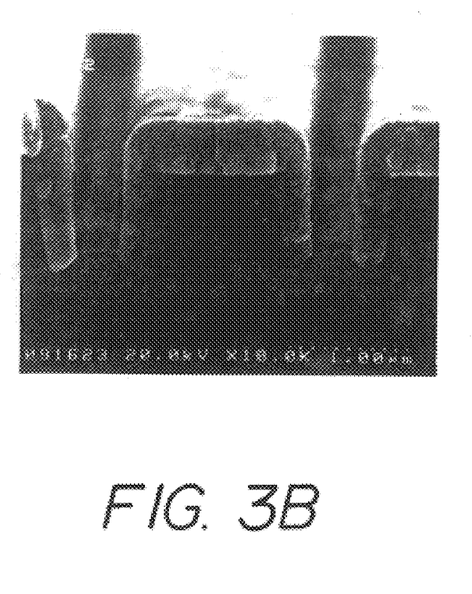
Figure 3C:
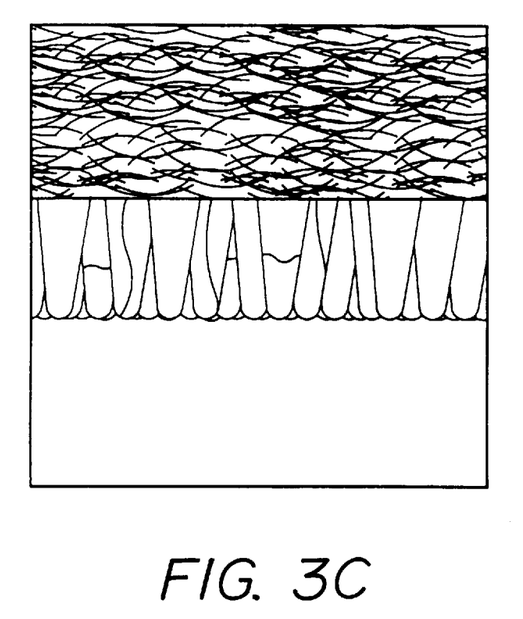
FIGS. 3C and 3D show photographs corresponding to FIGS. 3A and 3B.
Figure 3D:
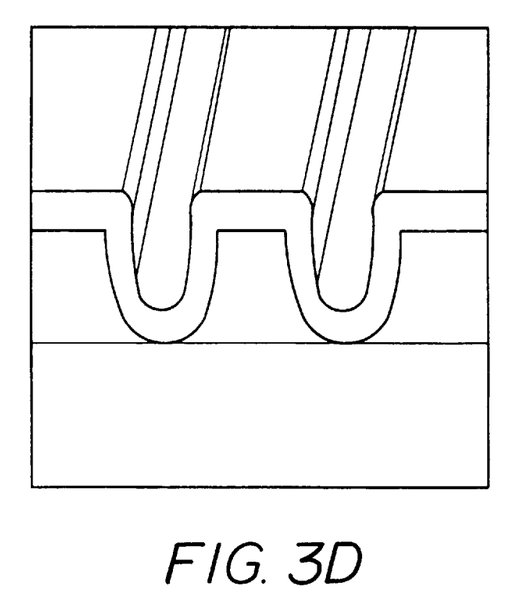

Next, referring to FIGS. 3 to 13, the process for producing a refractory metal by chemical vapor deposition of a bilayer-stacked tungsten metal provided by the invention takes advantage of the grainless structural characteristics on the boundary of an amorphous-like tungsten refractory metal to increase thermal stability thereof. Since, under scanning electronic microscopic observation, as shown in FIG. 3A, conventional refractory metal exhibits a cylinder structure of such cylinder structure is distributed straight along the metal surface down to the underlying substrate, unwanted impurities may diffuse quickly from the grain boundaries into the underlying substrate. While, as shown in FIG. 3B, the amorphous-like tungsten used in the invention has smaller grain and exhibits a non-cylinder structure also. Wherein, process conditions employed for depositing amorphous-like tungsten are as follows:

1. deposition temperature: 250° C.~350° C.;
2. chamber pressure: 80~120 mTorr;
3. flow rate of $SiH_4$: about 10~25 sccm;
4. flow rate of $WF_6$: about 10 sccm (ratio of flow rate between $SiH_4$ and $WF_6$=1).

Figure 4:
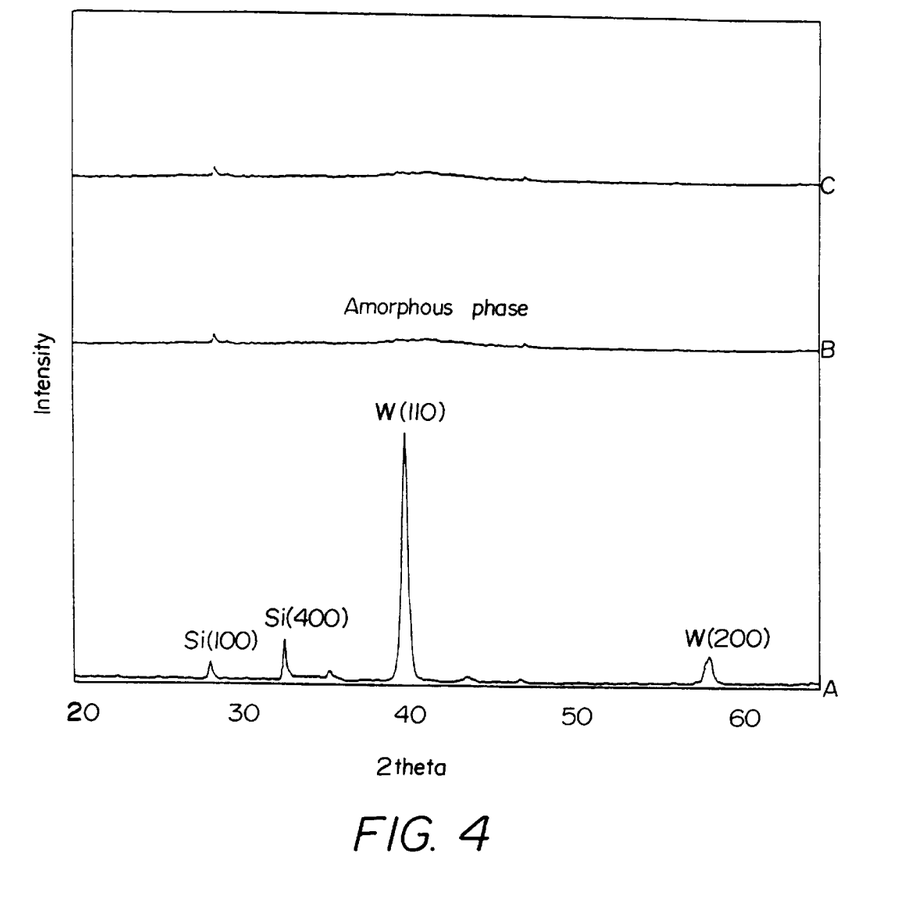
FIG. 4 shows X-ray diffraction patterns of a conventional chemical vapor deposited tungsten, an invention bilayer-stacked tungsten and a nitridized bilayer-stacked tungsten, respectively.

Curve A in FIG. 4 indicates the X-ray diffraction pattern obtained from a conventional chemical vapor deposited tungsten, while curves B and C refer to X-ray diffraction patterns from bilayer-stacked tungsten and nitridized bilayer-stacked tungsten. Under comparison, it is clear that bilayer-stacked tungsten had indeed higher thermal stability and reliability than that of a conventional chemical vapor deposited tungsten. Furthermore, it is known from X-ray diffraction analysis of the bilayer-stacked tungsten that tungsten deposited under these conditions is an amorphous directed metal.

Figure 5:
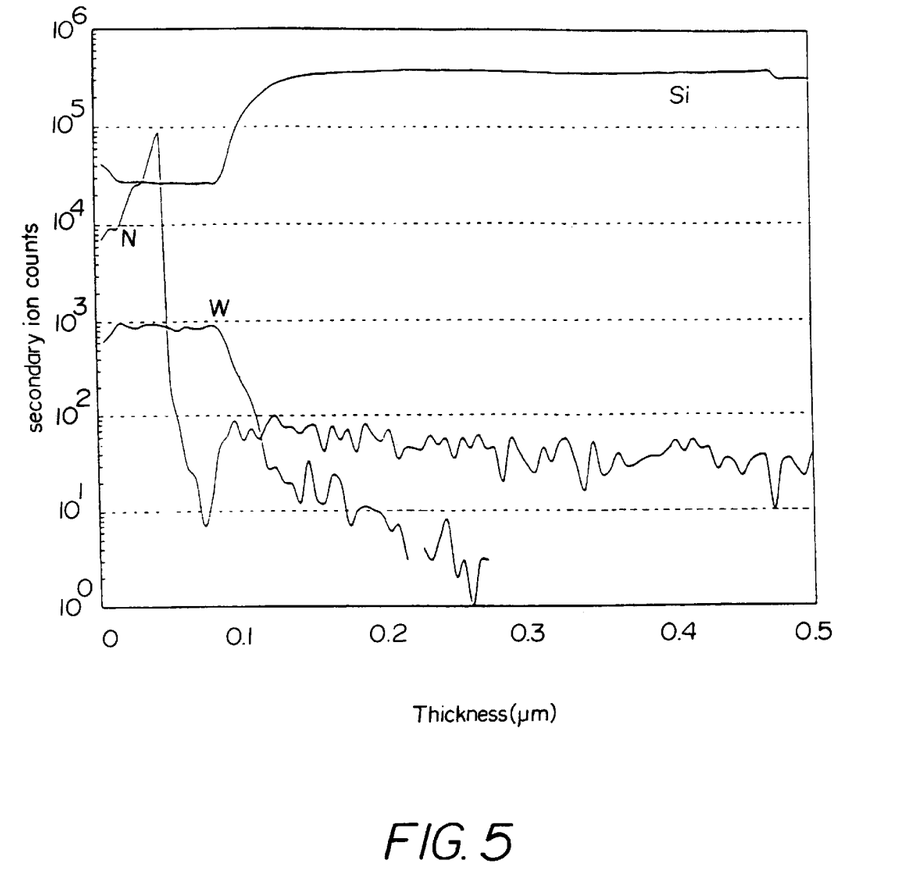
FIG. 5 shows the atomic depth distribution profile obtained from the invention nitridized amorphous-like tungsten by a secondary ion mass spectrophotometer.

After depositing the amorphous-like tungsten, a nitridizing treatment was carried out at a constant nitridizing temperature and pressure for 5 minutes wherein the flow rate of nitrogen was 80~120 sccm. The nitridizing treatment could result in the penetration of nitrogen atoms into the surface of the amorphous-like tungsten in a thickness of 50 nm, as shown in FIG. 5. Thereafter, a conventional tungsten layer was deposited thereon. It can be seen from curve C in FIG. 4 that the original orientation did not changed after nitridizing treatment.

Figure 6:
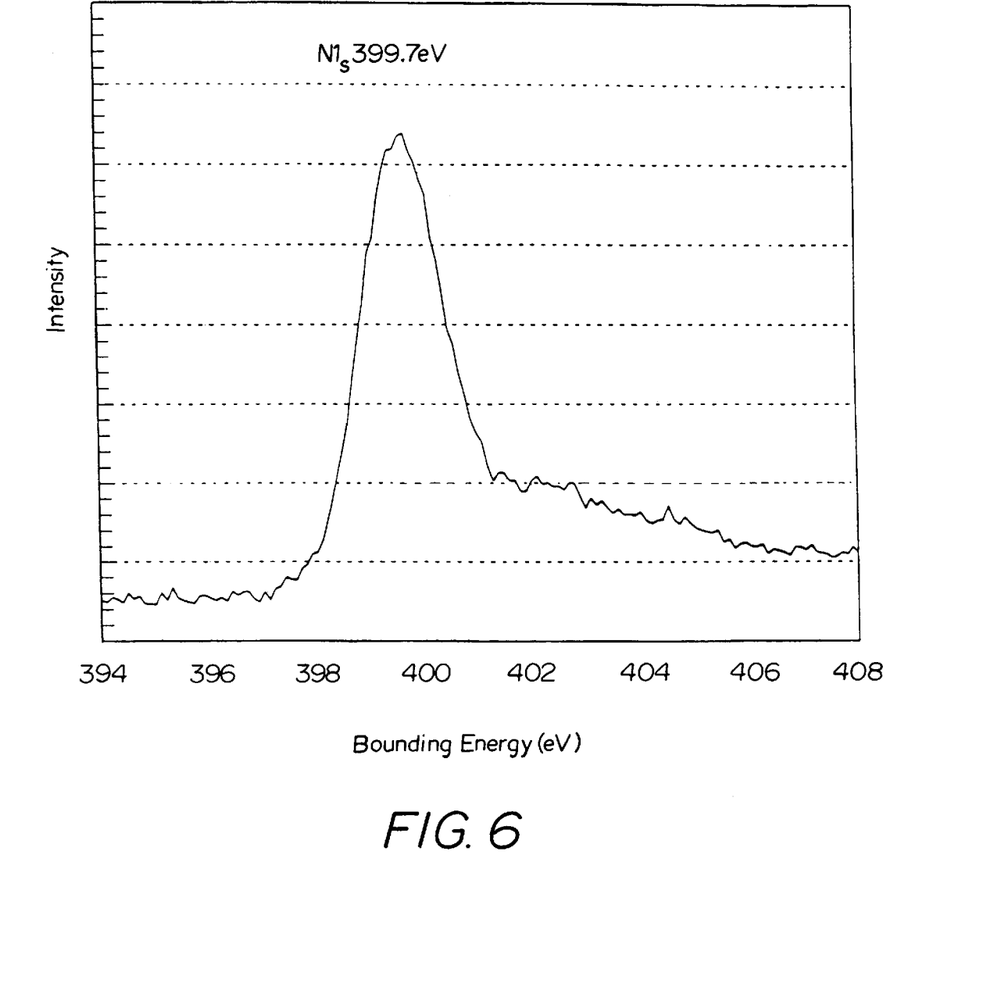
FIG. 6 is a diagram showing the state of surface bonding on the invention amorphous-like tungsten by an X-ray excitation frequency spectrum analyzer.

Further, from X-ray excitation frequency spectroscopy, a peak of NIS bond energy was observed at 399.7 eV, as shown in FIG. 6. If nitrogen atom bonds with tungsten at 397 eV, a peak will be formed. However, since bonding of nitrogen atom with tungsten might render the bond energy of nitrogen being affected by tungsten, in the present invention, nitrogen atom was prevented from diffusion in a manner of filling, that is, nitrogen atom did not bond with tungsten, but existed in tungsten metal in a manner of filling in interstices therein.

Figure 7:
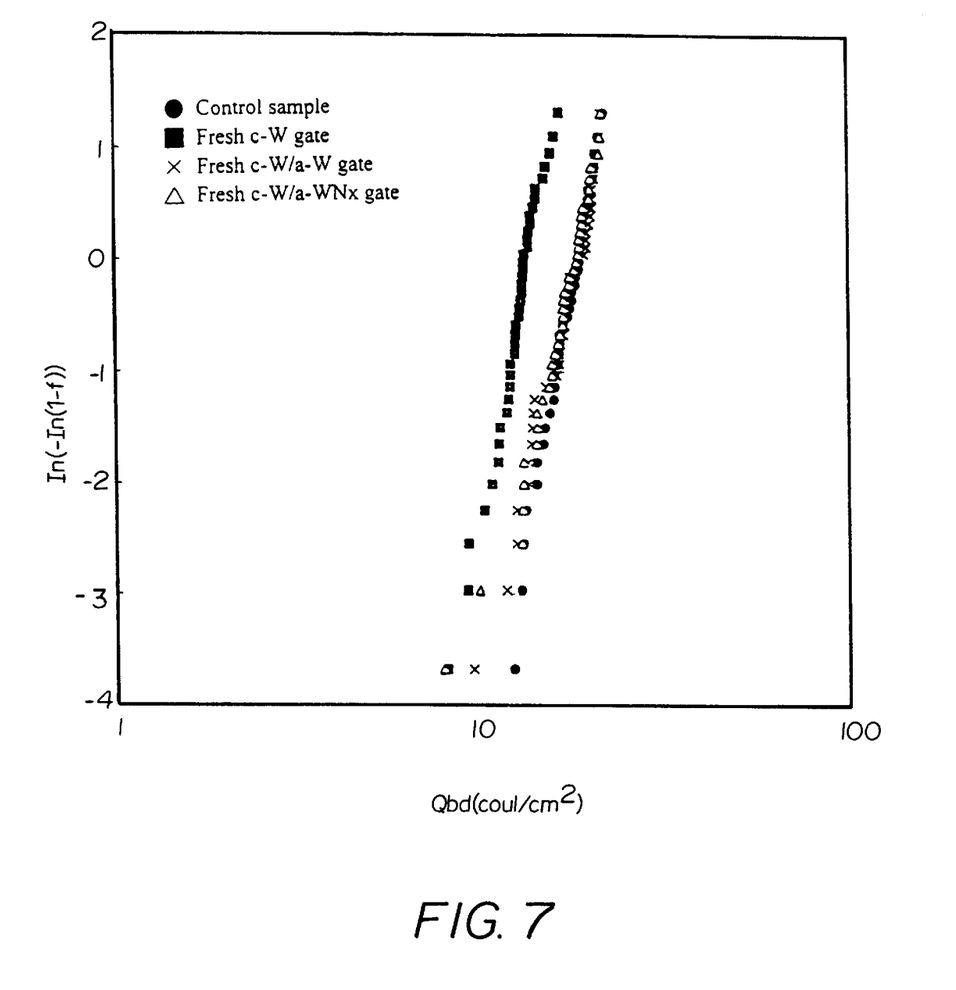
FIG. 7 is a diagram showing the collapse charge distribution of a conventional chemical vapor deposited tungsten, a bilayer-stacked tungsten and a nitridized bilayer-stacked tungsten.
Figure 8:
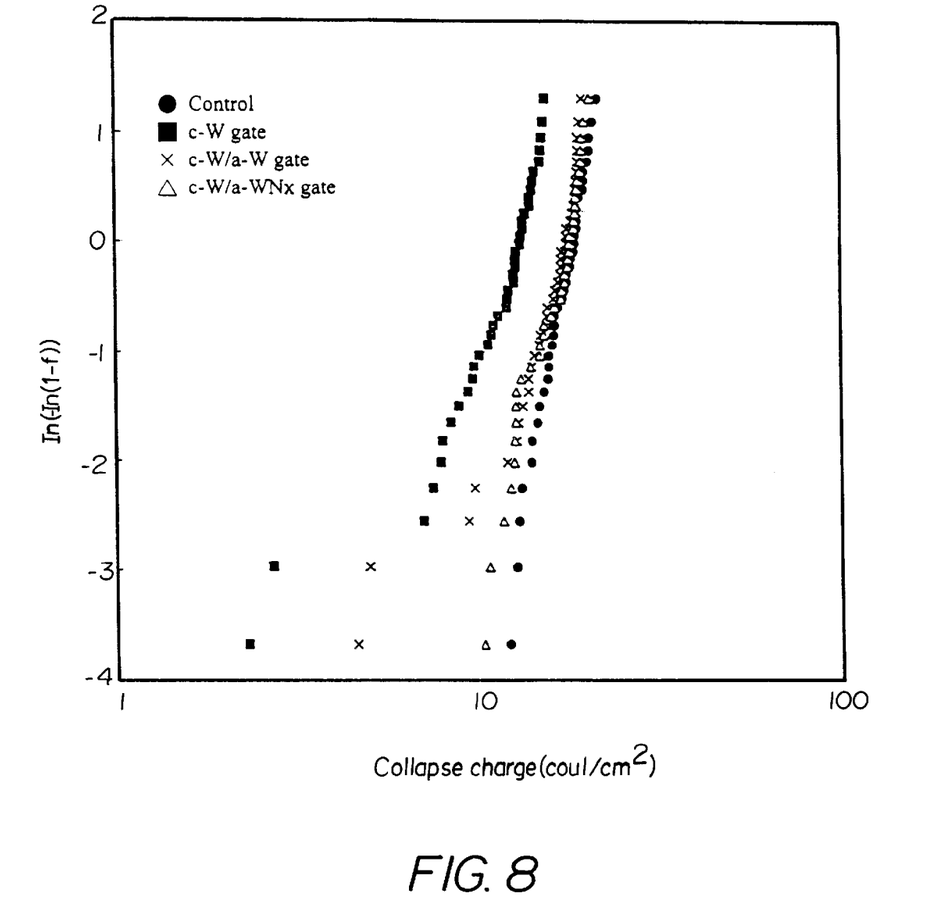
FIG. 8 is a diagram comparing collapse electric field distributions obtained from a conventional chemical vapor deposited tungsten, a bilayer-stacked tungsten and a nitridized bilayer-stacked tungsten after heat treating.

In addition, it is found from collapse charge test that bilayer tungsten, whether had been subject to nitridizing treatment or not, always had a much better characteristics than that of conventional single layer tungsten, as shown in FIG. 7. FIG. 8 shows results of collapse charge test performed on the MOS capacitor which had been treated at 700° C. for 5 minutes. It appeared again that bilayer tungsten, whether had been subjected to nitridizing treatment or not, had always a much better characteristics than that of the conventional single layer tungsten. Of course, nitridized bilayer tungsten exhibited a better characteristic that did not inferior to that of the test sample using polycrystalline silicon as the gate electrode, and meanwhile, resistance thereof is much lower than that of polycrystalline silicon gate device.

Figure 9:
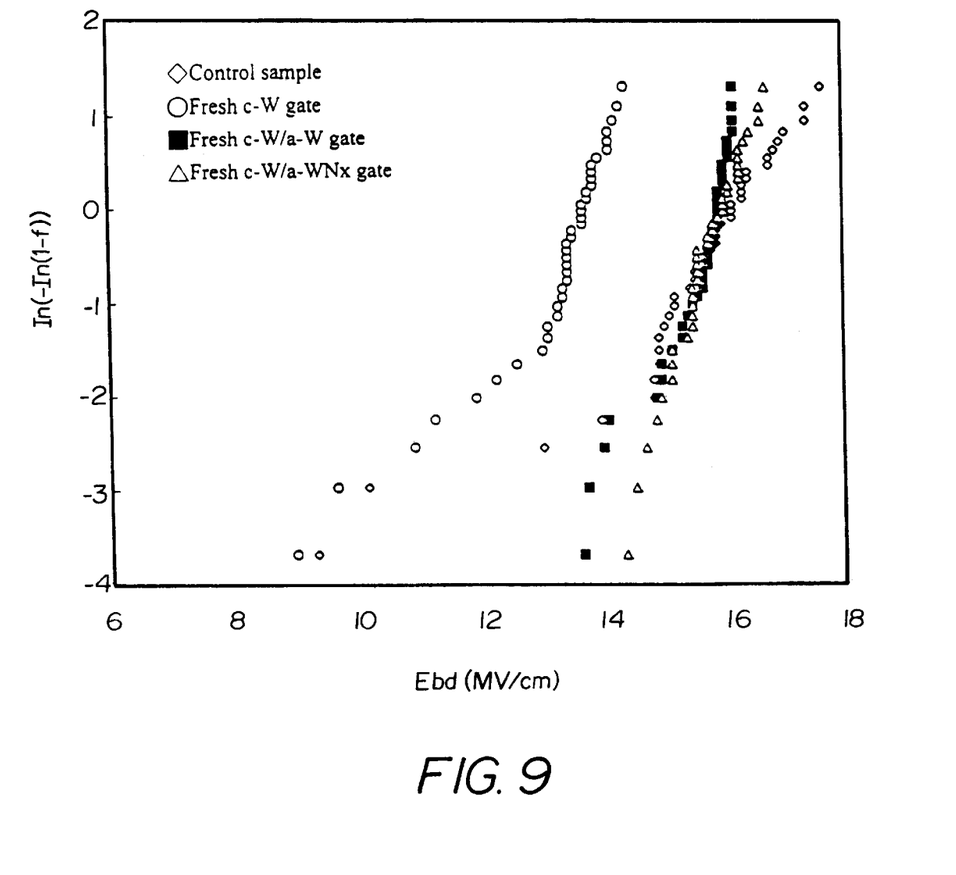
FIG. 9 is a diagram comparing collapse electric field distributions obtained from a conventional chemical vapor deposited tungsten, a bilayer-stacked tungsten and a nitridized bilayer-stacked tungsten.
Figure 10:
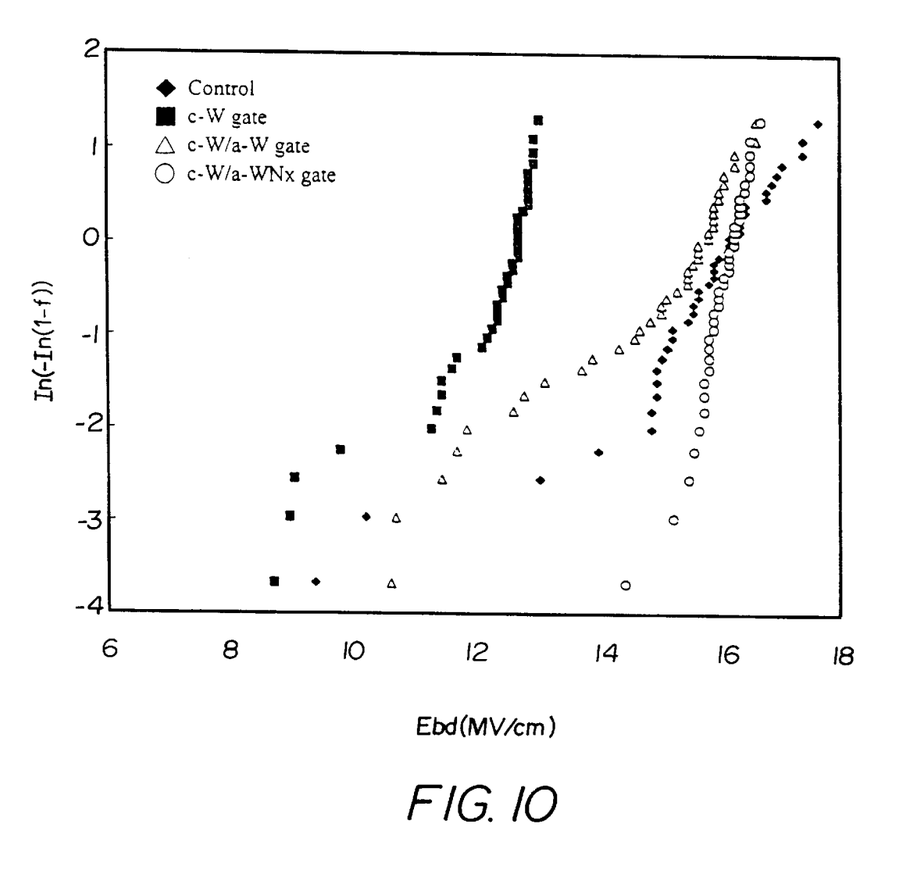
FIG. 10 is a diagram comparing collapse electric field distributions obtained from a conventional chemical vapor deposited tungsten, a bilayer-stacked tungsten and a nitridized bilayer-stacked tungsten after heat treating.

After being subjected to collapse electric field test, it had been found that bilayer tungsten, whether had been subjected to nitridizing treatment or not, always had a much better characteristics than that of conventional single layer tungsten, as shown in FIG. 9. FIG. 10 further demonstrates results of collapse electric field test performed on that MOS capacitor which had been treated at 700° C. for 5 minutes. It appeared again that bilayer tungsten, whether had been subjected to nitridizing treatment or not, had always a much better characteristics similar to the comparative result obtained from collapse charge test. The nitridized bilayer-stacked tungsten test specimen had even a somewhat better collapse electric field than that of a control sample. This happened on the fact that the presence of small amount of fluorine atom had a harden effect on the dielectric layer of the gate electrode, and amount of fluorine in test specimen of the nitridized bilayer-stacked tungsten could be controlled within a standard range so that a harden effect could be achieved.

Figure 11:
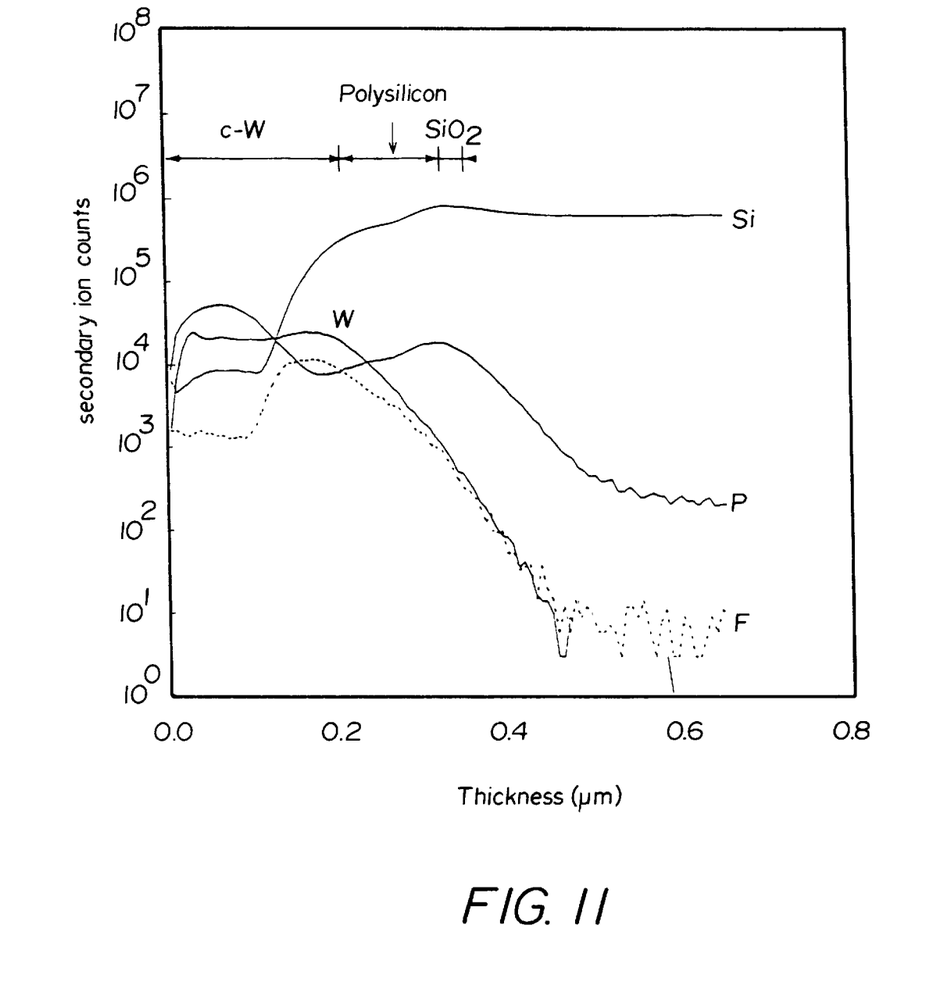
FIG. 11 is a diagram showing depth distribution profile of a conventional chemical vapor deposited tungsten measured by a secondary ion mass spectrophotometer.
Figure 12:
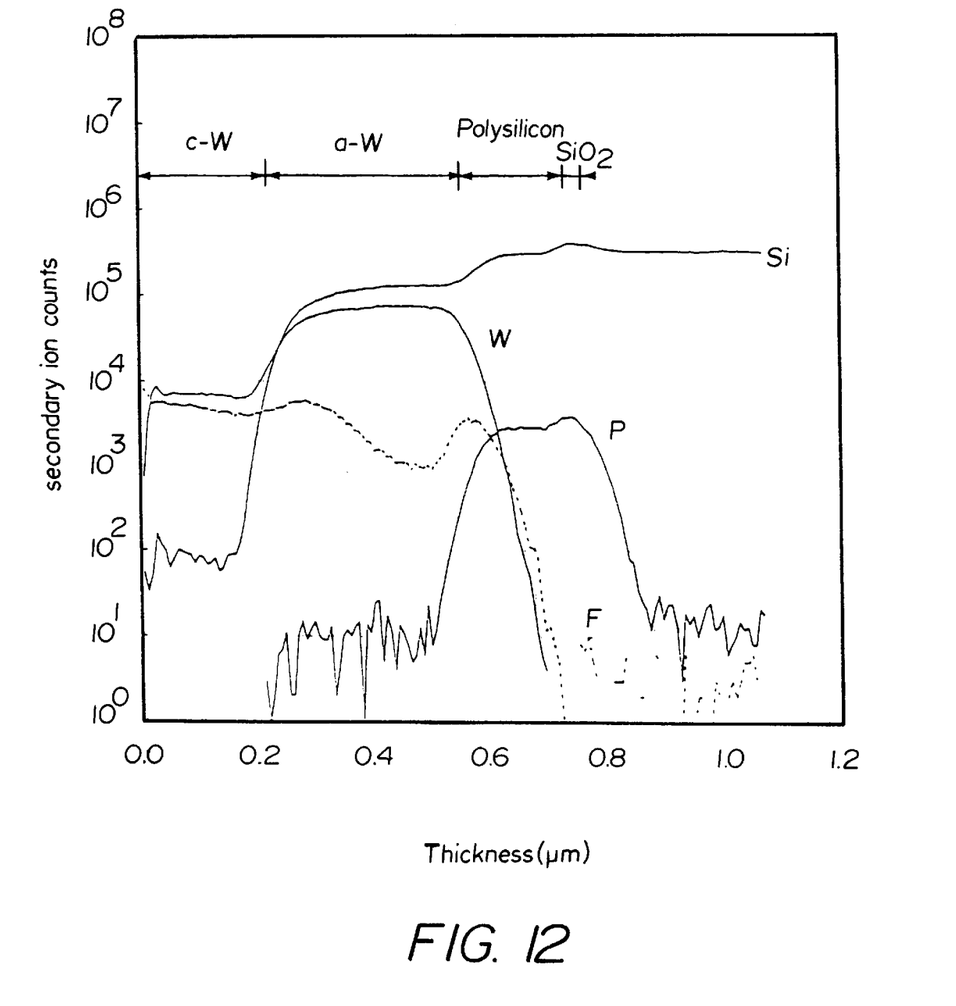
FIG. 12 is a diagram showing the depth distribution profile of the invention bilayer-stacked tungsten measured by a secondary ion mass spectrophotometer.

FIG. 11 is a diagram showing depth distribution profile of a conventional chemical vapor deposited tungsten measured by a secondary ion mass spectrophotometer (SIMS). It is evident that in a test specimen of conventional single layer chemical vapor deposited tungsten which had not subjected to heat treatment, fluorine atom had penetrated inside the silicon substrate, and even the phosphorus atom doped had diffused toward the inside of the silicon substrate. This happened on the sake that excess fluorine atoms had caused the damage of boundary. In contrary, bilayer tungsten metal could effectively prevent the diffusion of fluorine atom. Further, after being heat treated at 700° C. for 5 minutes, amount of fluorine atom in the dielectric layer of the gate electrode was much lower than that of conventional tungsten, as shown in FIG. 12, wherein, each boundary could be clearly identified.

Figure 13:
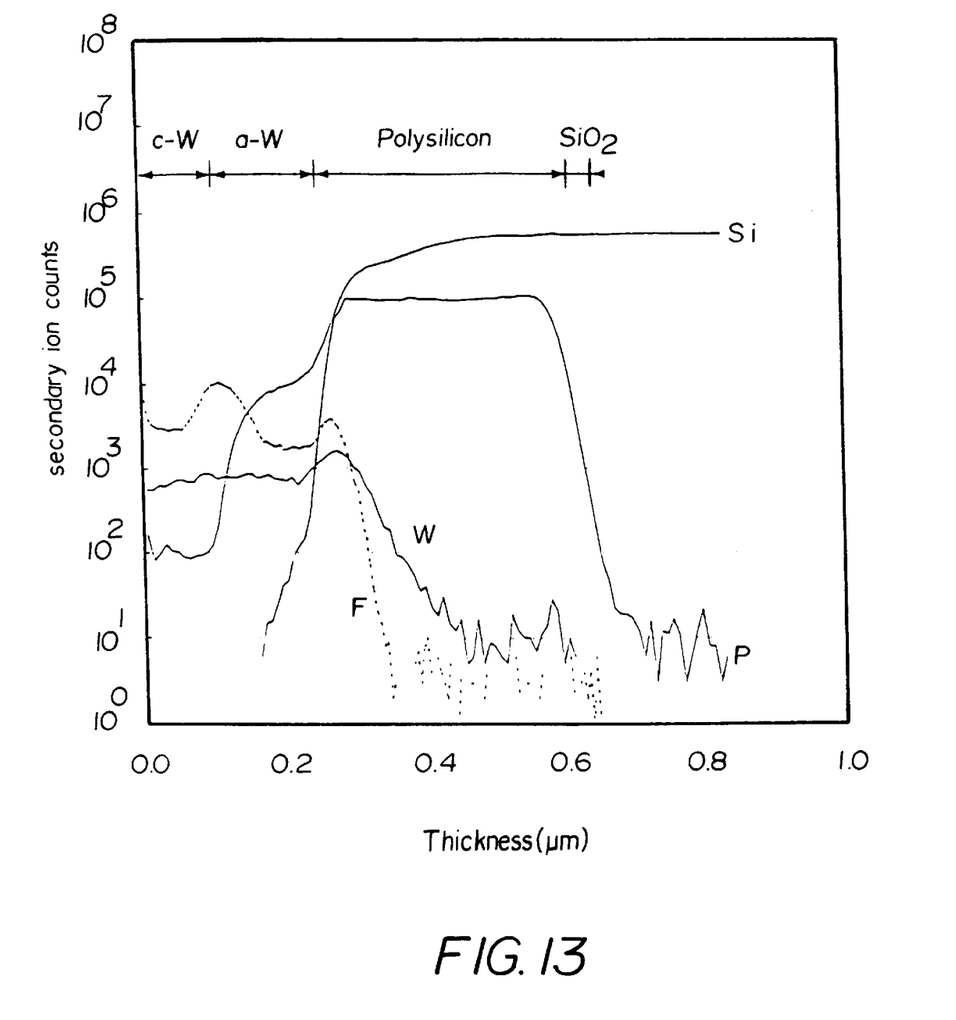
FIG. 13 is a diagram showing the depth distribution profile of the inventive nitridized bilayer-stacked tungsten measured by a secondary ion mass spectrophotometer.

Finally, from FIG. 13, it is evident that, after being heat treated at 700° C. for 5 minutes, amounts of fluorine atom in the dielectric layer of the gate electrode and in the test specimen not subjected to nitridizing treatment were lower than detection limit. Although SIMS spectrum could not compare the barrier effects between un-nitridized and nitridized bilayer tungsten metals, it had been confirmed in the collapse charge test that the nitridized bilayer tungsten metal had better barrier effect.

The process for producing a refractory metal by chemical vapor deposition of bilayer-stacked tungsten metal according to the invention has following advantages when compared with the conventional technique:

1. A pure refractory metal was used to replace the refractory metal silicide to achieve a lower resistance.
2. Since amorphous-like tungsten has essentially grainless structure, fluorine atom can not diffuse into the underlying material via the boundary during chemical grain deposition.
3. The deposited amorphous-like tungsten can be subjected to a nitridizing treatment in a manner of not breaking the vacuum so that the thermal stability thereof can be more excellent.
4. The amorphous-like tungsten is a deposit that nucleates in the gas phase. Therefore, in the course of their deposition, silicon on the surface of the substrate does not consumed such that atoms doped in the polycrystalline silicon, such as phosphorus, boron, and arsenic will be confined and can not diffuse outwardly.

Many changes and modifications in the above-described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A process for producing a refractory metal by chemical vapor deposition of a bilayer-stacked tungsten metal, comprising steps of:

a. growing a oxide layer as silicon dioxide having a thickness of 500 nm to be used as an insulating barrier;

b. defining a work region by yellow light imaging;

c. growing a silicon dioxide layer having a thickness of 10 nm to be used as the dielectric layer in the gate electrode;

d. growing a polycrystalline silicon layer having a thickness of 250 nm to be used as a stress buffering layer;

e. growing an amorphous-like tungsten layer having a thickness of 50 nm;

f. nitridizing treatment; and g growing a tungsten layer having a thickness of 200 nm; characterized in that a bilayer-stacked tungsten MOS capacitor or MOSFET structures that do not influence the propagation resistance thereof and that has an increased thermal stability and can prevent the inward diffusion of fluorine atom can be formed.

2. A process for producing refractory metal by chemical vapor deposition of a bilayer-stacked tungsten metal as recited in claim 1, wherein in said steps e to g, a bilayer-stacked tungsten is used as the gate electrode or as interconnection line in said MOSFET or MOS capacitor.

3. A process for producing a refractory metal by chemical vapor deposition of a bilayer-stacked tungsten metal as recited in claim 2, wherein in said steps e to g, said bilayer-stacked tungsten metal is deposited in a manner of not breaking the vacuum.

4. A process for producing a refractory metal by chemical vapor deposition of a bilayer-stacked tungsten metal as recited in claim 3, wherein in said steps e to g, said tungsten metal is subjected further to a nitridizing treatment so as to increase the carrier effect against the diffusion of fluorine atom.

5. A process for producing a refractory metal by chemical vapor deposition of a bilayer-stacked tungsten metal as recited in claim 1, wherein in said step e, said amorphous-like tungsten metal is deposited under the following conditions:

deposition temperature: 250° C.~350° C.;
    chamber pressure: 80~120 mTorr;
    flow rate of $SiH_4$; about 10~25 sccm;
    flow rate of $WF_6$: about 10 sccm.

6. A process for producing a refractory metal by chemical vapor deposition of a bilayer-stacked tungsten metal as recited in claim 1, wherein said nitridizing treatment in said step f is carried out in a constant temperature and pressure while the flow rate of nitrogen gas is 80~120 sccm.

* * * * *